United States Patent
Ker et al.

(10) Patent No.: US 7,023,676 B2
(45) Date of Patent: Apr. 4, 2006

(54) LOW-VOLTAGE TRIGGERED PNP FOR ESD PROTECTION IN MIXED VOLTAGE I/O INTERFACE

(75) Inventors: Ming-Dou Ker, Hsinchu (TW); Wen-Yu Lo, Taichung (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 535 days.

(21) Appl. No.: 10/383,643

(22) Filed: Mar. 10, 2003

(65) Prior Publication Data

US 2004/0085691 A1 May 6, 2004

(30) Foreign Application Priority Data

Nov. 1, 2002 (TW) .............................. 91132361 A

(51) Int. Cl.
*H02H 9/00* (2006.01)
(52) U.S. Cl. ..................................... 361/56; 361/91.1
(58) Field of Classification Search .................. 361/56, 361/91.1
See application file for complete search history.

(56) References Cited

U.S. PATENT DOCUMENTS

| 6,610,262 B1 * | 8/2003 | Peng et al. ................. 423/197 |
| 6,642,088 B1 * | 11/2003 | Yu .............................. 438/155 |
| 6,724,592 B1 * | 4/2004 | Tong et al. .................... 361/56 |
| 6,838,908 B1 * | 1/2005 | Ker et al. ..................... 326/83 |

\* cited by examiner

*Primary Examiner*—Stephen W. Jackson
(74) *Attorney, Agent, or Firm*—Birch, Stewart, Kolasch & Birch, LLP

(57) ABSTRACT

An low-voltage triggered PNP device for input signals with voltage level larger than VDD or less than VSS. The ESD protection device provides an ESD path from a first to a second node for protection of an internal circuit. The device comprises a substrate of a first conductivity type coupled to the first node, a first doped region of a second conductivity type in the substrate, wherein the first doped region is floated, a second doped region of the first conductivity type in the first doped region coupled to the second node, and a third doped region in the substrate, adjacent to the first doped region, to have a low trigger voltage.

36 Claims, 10 Drawing Sheets

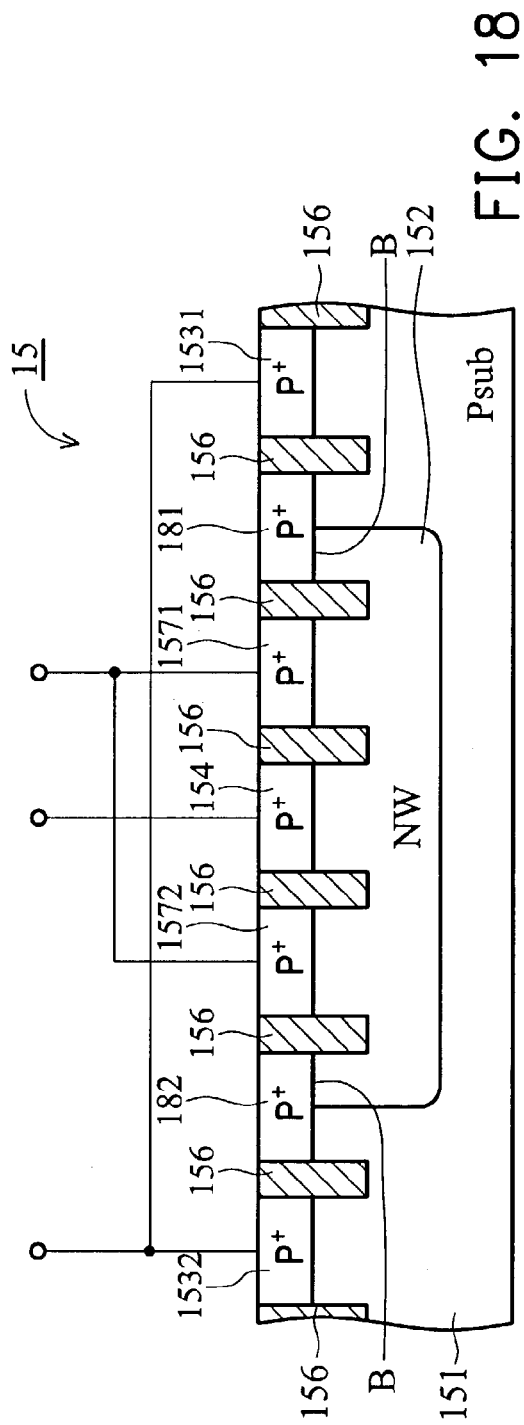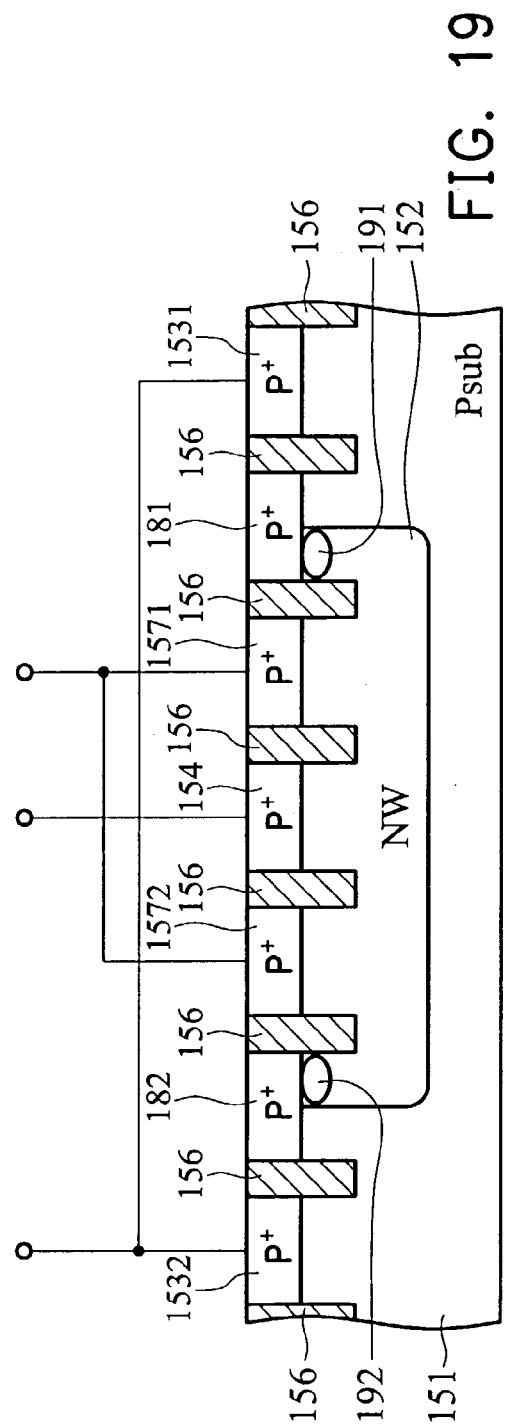

LOW-VOLTAGE TRIGGERED PNP FOR ESD PROTECTION IN MIXED VOLTAGE I/O INTERFACE

BACKGROUND OF THE INVENTION

1. Field of the Invention

The present invention relates to an ESD protection device and particularly to an ESD protection device for input signals with voltage level higher than VDD or lower than VSS.

2. Description of the Prior Art

ESD protection is one of the main reliability concerns for IC products, especially when scaled down into the deep submicron regime, and the thinner gate oxide of the MOS become more vulnerable to ESD stress. For general industrial specification, the input and output pins of IC products have to sustain HBM (Human Body Model) ESD stress over 2000V and MM (Machine Model) ESD stress over 200V. Therefore, ESD protection circuits must be disposed around the input and output (I/O) pads of the IC.

FIGS. 1~3 are diagrams showing three traditional ESD protection devices.

In FIG. 1, the ESD protection device 1 includes two diodes 11 and 12 connected between the input pad 13 and the power supply VDD, and input pad 13 and the power supply VSS, respectively. The diode 11 is turned on by a positive ESD pulse across the input pad 13 that flows therefrom to the power supply VDD rather than to the internal circuit 14. Similarly, diode 12 is turned on by a negative ESD pulse across the input pad 13 that flows therefrom to the power supply VSS rather than to the internal circuit 14.

In FIG. 2, the ESD protection device 2 includes a P-type transistor 21 and N-type transistor 22. Operations of the ESD protection devices 1 and 2 are similar. The transistors 21 and 22 are turned on by a positive and negative ESD pulse across the input pad 23 that flows therefrom to the power supply VDD and VSS, respectively. This protects the internal circuit 24 from damage by ESD.

In FIG. 3, the ESD protection device 3 includes a field-oxide NMOS 31, a N-type transistor 32 and a resistor R. The field-oxide NMOS 31 and the N-type transistor 32 provide an ESD path from the input pad 33 to the power supply VSS, which prevents the ESD current from flowing to the internal circuit 34.

Generally speaking, the highest and minimum voltage levels of the input signals of integrated circuits are between the power supply voltages VDD and VSS. However, with the advance of the CMOS manufacturing process, ICs derived from different processes operate at different voltages. For example, the ICs derived from a 0.5 μm CMOS process operate at VDD of 5V, while those derived from a 0.18 μm CMOS process operate at VDD of 1.8V. On a single circuit board, there may be several ICs providing different functions and having I/O pads electrically connected with each other. Thus, each IC may receive I/O signals with different high and low voltage levels. For example, an IC using VDD of 1.8 or 3.3V may receive signals having a high voltage level of 5V output from another IC. This results in an input signal level higher than VDD. Similarly, some situations may cause an input signal lower than VSS. Moreover, in some ICs for network communication, such as ICs receiving signals from a remote device through connection lines, there may be input signals with voltage levels higher than VDD and lower than VSS. The previously described traditional ESD protection devices do not apply to an IC receiving input signals with voltage levels higher than VDD or lower than VSS since they induce leakage currents.

FIGS. 4~6 are diagrams showing three traditional ESD protection devices applicable to ICs receiving input signals with voltage levels higher than VDD or lower than VSS.

The ESD protection device shown in FIG. 4 is applicable to ICs receiving input signals with voltage levels higher than VDD. The PMOS transistor 41 has a gate connected to a gate voltage tracking circuit 42, a source connected to the power supply VDD, a drain connected to the input pad 43 and a bulk connected to a floating N well (not shown). The gate voltage tracking circuit 42 is connected with the pad 43 and the power supply VDD. The cascaded transistors 44 and 45 are connected between the pad 43 and the power supply VSS. The gates of NMOS transistors 44 and 45 are connected to the power supply VDD and VSS respectively. Although this circuit provides ESD protection for ICs receiving input signals with voltage levels higher than VDD, the ICs are easily damaged by ESD due to low ESD performance.

In FIG. 5, the ESD protection device is applicable to ICs receiving input signals with voltage levels lower than VSS. It includes a PNP bipolar junction transistor 51, a silicon controlled rectifier 52 and a PMOS transistor 54. Although this circuit provides ESD protection for ICs receiving input signals with voltage levels lower than VSS, the N well 521 is floated to prevent forward bias of the parasitic diode formed by the junction between the P substrate 522 and N well 521, which makes the silicon controlled rectifier 52 easy to be unintentionally triggered on. This results in latch-up of the circuit.

In FIG. 6, the ESD protection device is applicable to ICs receiving input signals with voltage levels higher than VDD and lower than VSS. It includes a PNP bipolar junction transistor 61 connected between the input pad 63 and the power supply VSS, a silicon controlled rectifier 62 connected between the input pad 63 and the power supply VSS. Similarly to the ESD protection device shown in FIG. 5, although this circuit provides ESD protection for ICs receiving input signals with voltage levels higher than VDD and lower than VSS, the N well 621 is also floated, which makes the silicon controlled rectifier 62 easy to be unintentionally triggered on. This results in latch-up of the circuit.

SUMMARY OF THE INVENTION

The object of the present invention is to provide an ESD protection device for input signals with voltage level larger than VDD or less than VSS without leakage current or signal distortion.

The present invention provides an ESD protection device for input signals with voltage level larger than VDD or less than VSS. The ESD protection device provides an ESD path from a first to a second node for protection of an internal circuit from ESD damage. The device comprises a substrate of a first conductivity type coupled to the first node, a first doped region of a second conductivity type in the substrate, wherein the first doped region is floated, a second doped region of the first conductivity type in the first doped region, coupled to the second node, and a third doped region in the substrate, adjacent to the first doped region.

The present invention also provides an ESD protection device for input signals with voltage level larger than VDD or less than VSS, which provides an ESD path from a first to a second node and the second to a third node for protection of an internal circuit from ESD damage. The device comprises a substrate of a first conductivity type coupled to the first node, a first doped region of a second conductivity type in the substrate, wherein the first doped region is floated, a second doped region of the first conductivity type in the first doped region, coupled to the second node, a third doped region in the substrate, adjacent to the first doped region, and a fourth doped region of the first conductivity type in the first doped region, coupled to the third node.

BRIEF DESCRIPTION OF THE DRAWINGS

The present invention will become more fully understood from the detailed description given hereinbelow and the accompanying drawings, given by way of illustration only and thus not intended to be limitative of the present invention.

FIG. 18 is a diagram showing an ESD protection device according to a ninth embodiment of the invention.

FIG. 19 is a diagram showing an ESD protection device according to a tenth embodiment of the invention.

DETAILED DESCRIPTION OF THE INVENTION

First Embodiment

Figure 1:
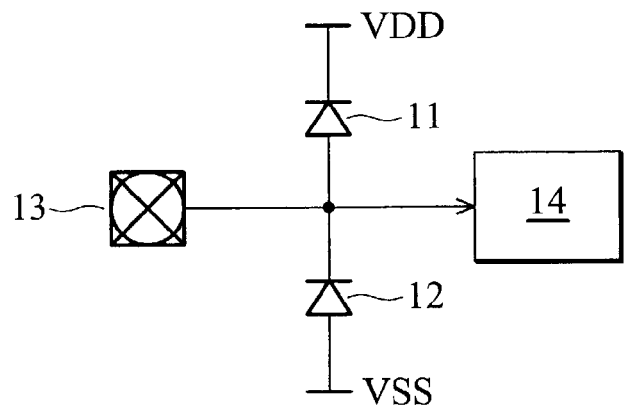
FIGS. 1~3 are diagrams showing three traditional ESD protection devices for input signals with voltage levels between VDD and VSS.
Figure 2:
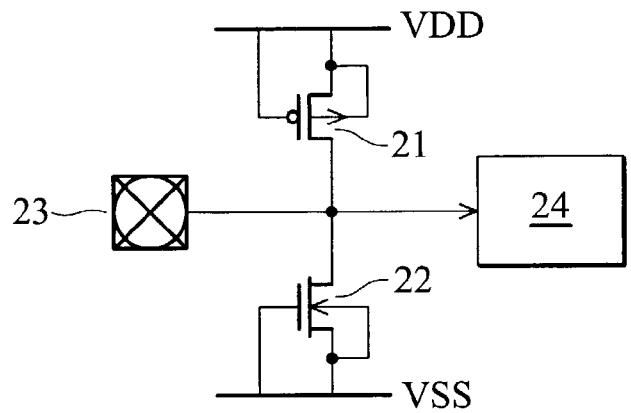
Figure 3:
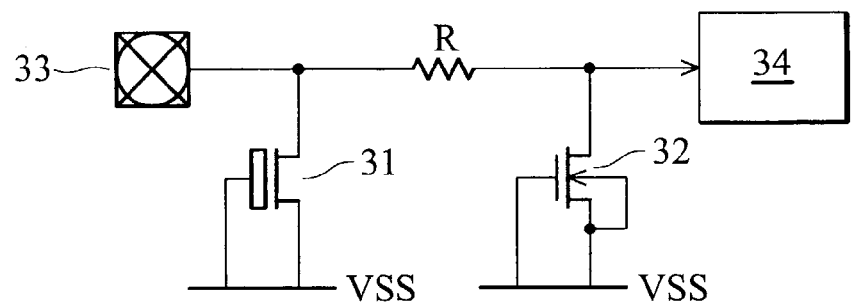
Figure 4:
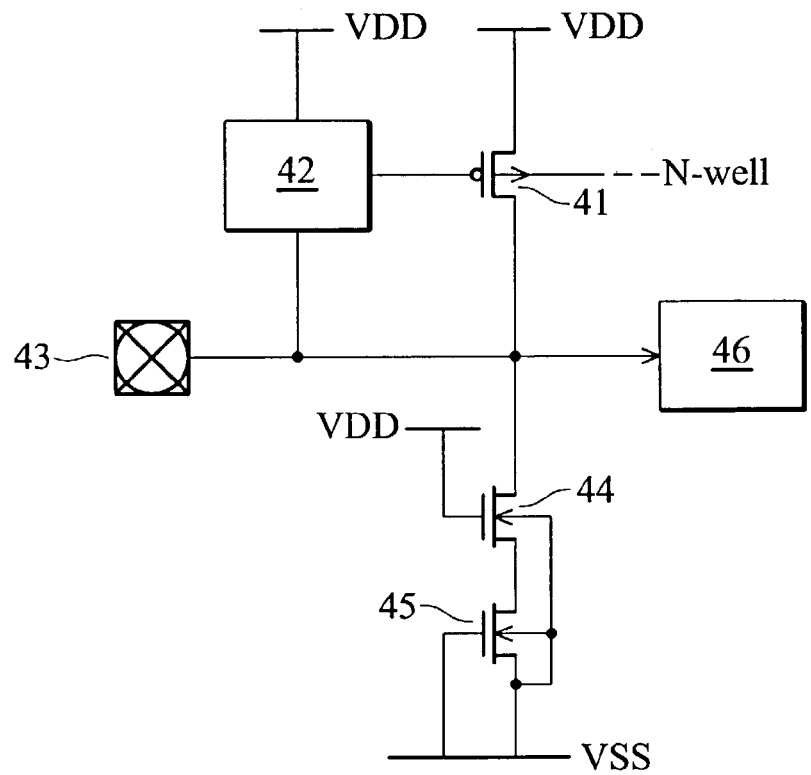
FIG. 4 is a diagram showing a traditional ESD protection devices for input signals with voltage levels higher than VDD.
Figure 5:
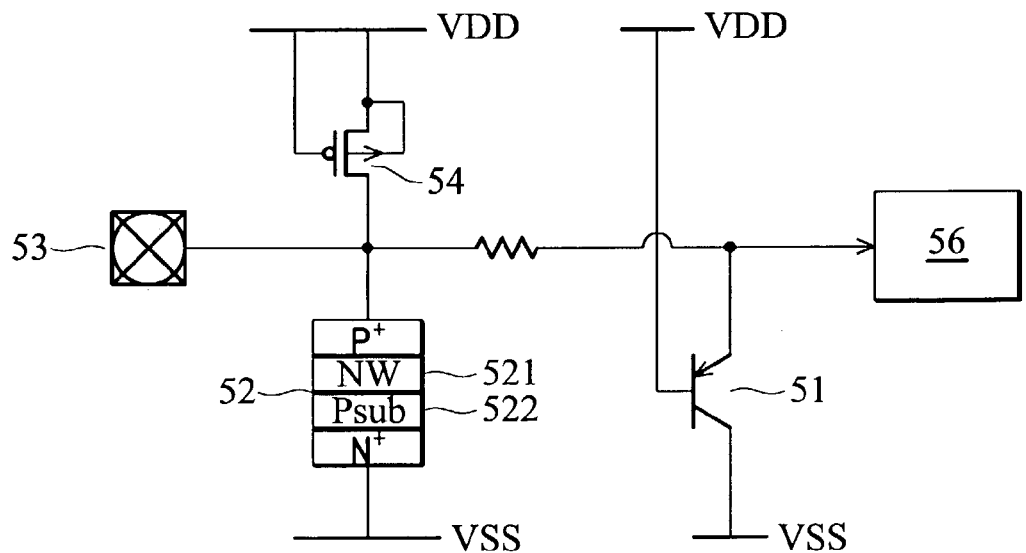
FIG. 5 is a diagram showing a traditional ESD protection devices for input signals with voltage levels lower than VSS.
Figure 6:
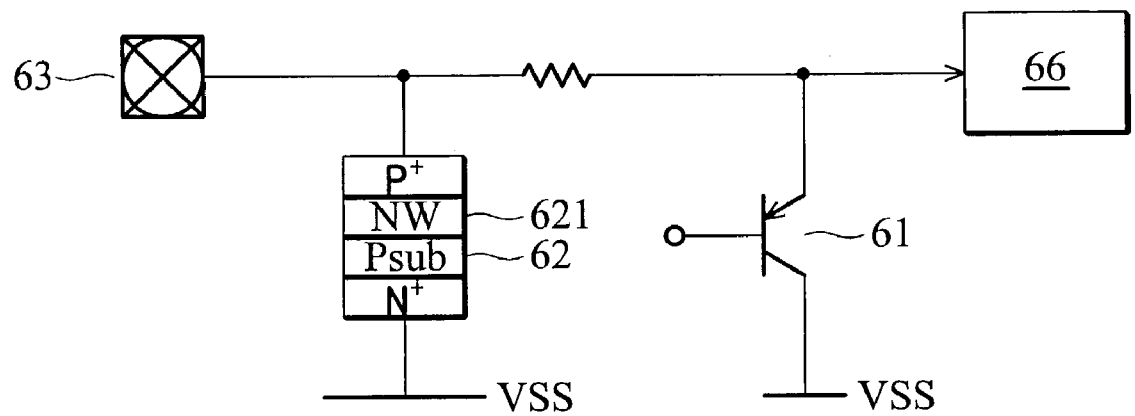
FIG. 6 is a diagram showing a traditional ESD protection devices for input signals with voltage levels higher than VDD and lower than VSS.
Figure 7:
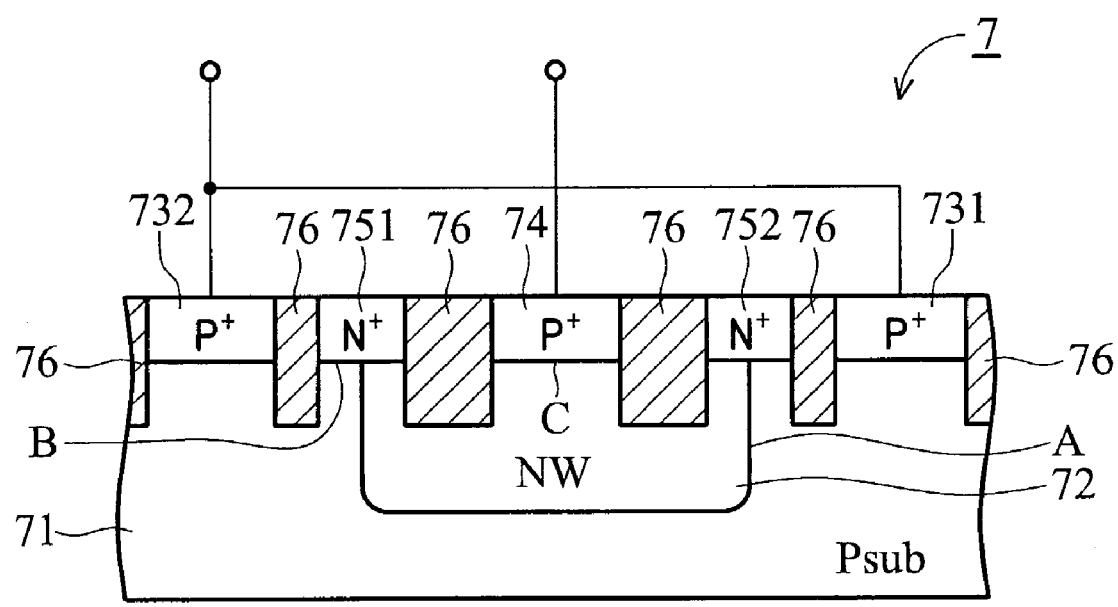
FIG. 7 is a diagram showing an ESD protection device according to a first embodiment of the invention.

FIG. 7 is a diagram showing an ESD protection device according to a first embodiment of the invention. The ESD protection device 7 includes a P substrate 71, a N well 72 in the P substrate 71, P-type heavily doped regions 731 and 732 in the P substrate 71, a P-type heavily doped region 74 in the N well 72, N-type heavily doped regions 751 and 752 adjacent to the N well 72, and isolation layers 76 isolating the doped regions 731, 732, 74, 751 and 752. Thus formed, the structure is equivalent to a PNP bipolar junction transistor with a low breakdown voltage and a floating bulk, which may be called LVTPNP (Low Voltage Triggered PNP). It provides a current path between the emitter and collector when the PN or NP junction avalanches. The emitter is formed by the P-type heavily doped region 74. The base is formed by the N well 72, and N-type heavily doped regions 751 and 752. The collector is formed by the P substrate 71, and the P-type heavily doped regions 731 and 732. Those skilled in the art will appreciate that the P-type heavily doped regions 731 and 732 are used as contact regions coupling the P substrate 71 to another element or to receive a voltage level. On the contrary, the N-type heavily doped regions 751 and 752, rather than being used as contact regions, are floated by way of electrical isolation from any other element. That is to say, the base of the LVTPNP is floated. Thus, only the PN or NP junction may be forward biased when there is no ESD pulse to eliminate leakage current. Moreover, The junction C has a low breakdown voltage since the region 74 is heavily doped, while the junction A has a relatively high breakdown voltage since both the N well 72 and P substrate 71 are lightly doped. The junction A is disadvantageous to formation of the ESD current path. Fortunately, the N-type heavily doped regions 751 and 752 compensate for this disadvantage. The junction B has a low breakdown voltage due to the heavily doped regions 751 and 752, which avalanches earlier than the junction A when the ESD pulse zapping the pad. Accordingly, the N-type heavily doped regions 751 and 752 may be disposed in any location adjacent to the N well 72 and are not limited to the locations shown in FIG. 7.

Figure 8:
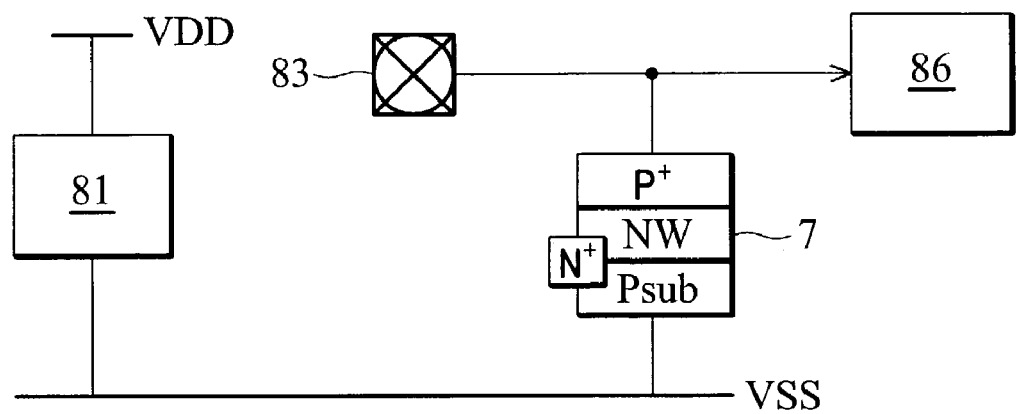
FIG. 8 is a diagram showing an input circuitry including the ESD protection device in FIG. 7.

FIG. 8 is a diagram showing an input circuitry including the ESD protection device in FIG. 7. It includes an ESD clamp circuit 81 and the ESD protection device 7. The ESD clamp circuit 81 is connected between the VDD and VSS power lines, which provides an ESD path therebetween. The ESD protection device 7 is connected between the input pad 83 and the VSS power line, which provides an ESD path therebetween.

Figure 9:
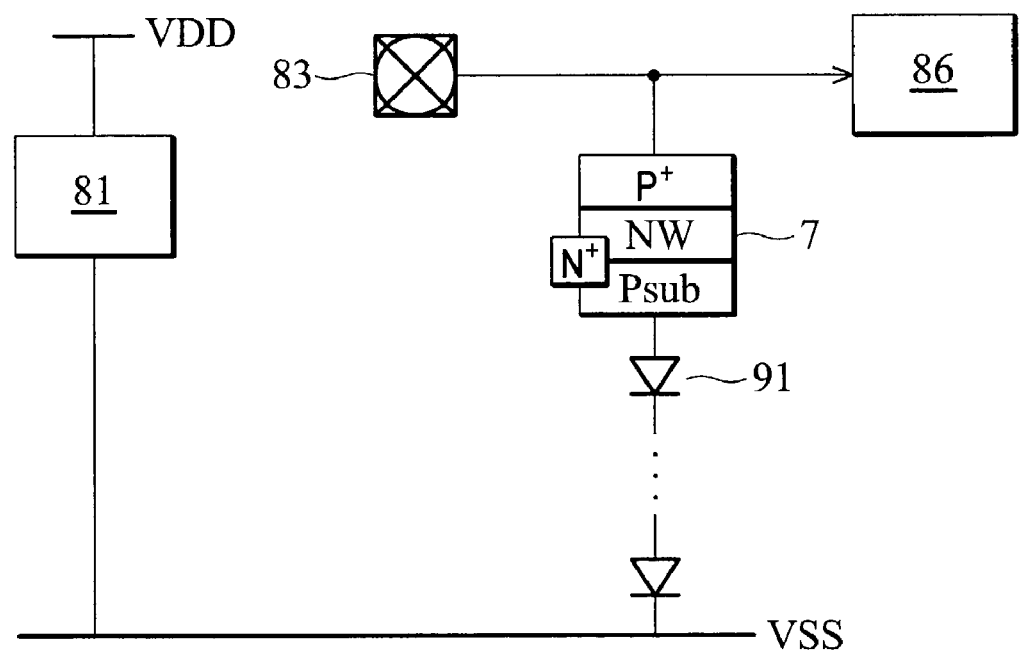
FIG. 9 is a diagram showing another input circuitry including the ESD protection device in FIG. 7.

FIG. 9 is a diagram showing another input circuitry including the ESD protection device in FIG. 7. The input circuitry shown in FIG. 9 is similar to that shown in FIG. 8 except that there are diodes 91 serially connected in the same direction between the ESD protection device 7 and the VSS power line in the input circuitry shown in FIG. 9. The diodes 91 adjust the total holding voltage level of the ESD protection circuit between the pad 83 and VSS.

Second Embodiment

Figure 10:
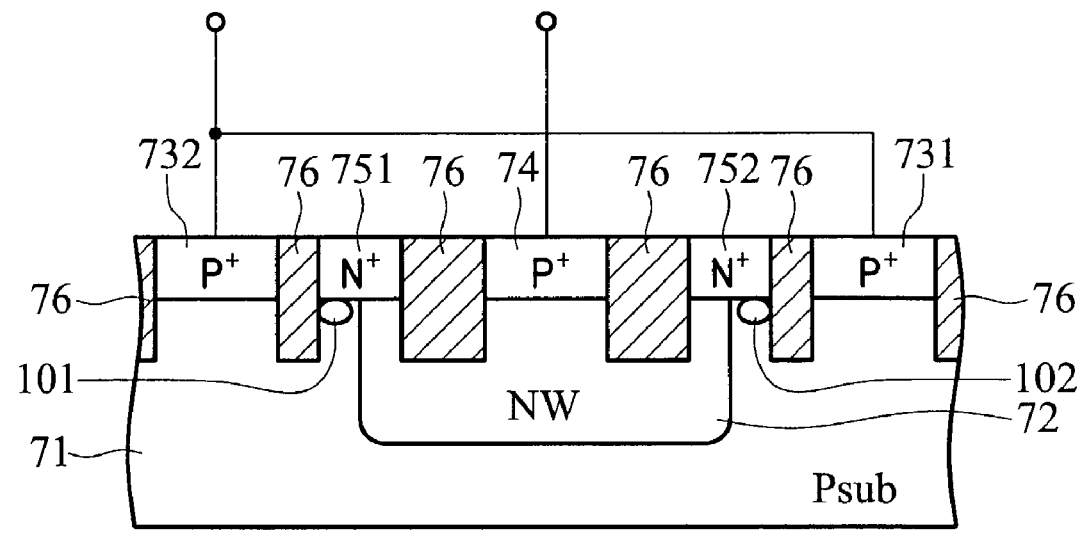
FIG. 10 is a diagram showing an ESD protection device according to a second embodiment of the invention.

FIG. 10 is a diagram showing an ESD protection device according to a second embodiment of the invention. The same elements in FIGS. 7 and 10 refer to the same symbols for clarity. It is noted that there are P-type ESD implantation regions 101 and 102 below the N-type heavily doped regions 751 and 752, in addition to the device shown in FIG. 7. The P-type ESD implantation regions 101 and 102 are doped more heavily than the P substrate, which forms a junction therebetween with a lower breakdown voltage.

Third Embodiment

Figure 11:
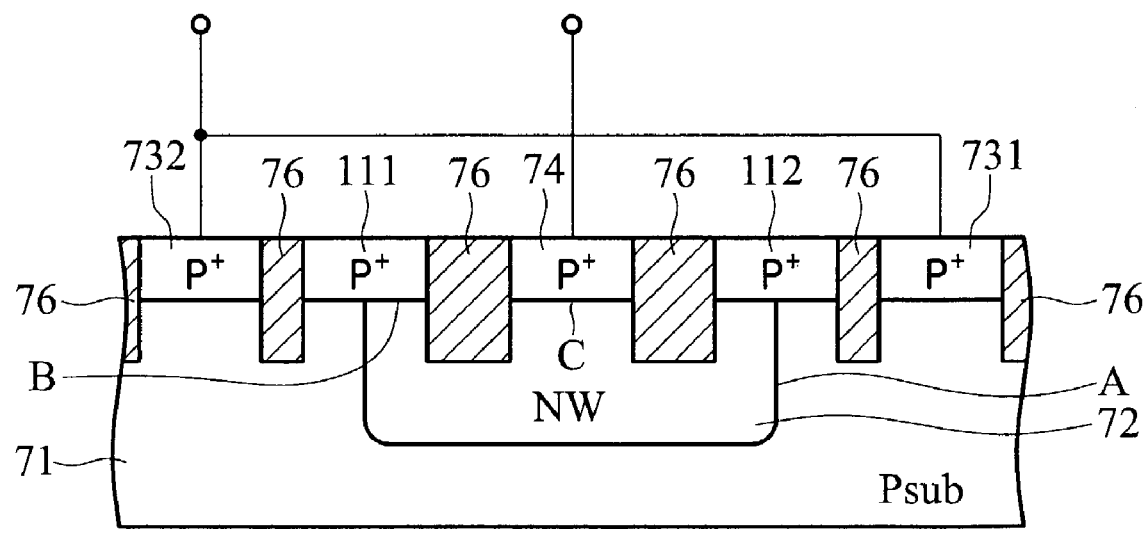
FIG. 11 is a diagram showing an ESD protection device according to a third embodiment of the invention.

FIG. 11 is a diagram showing an ESD protection device according to a third embodiment of the invention. The same elements in FIGS. 7 and 11 refer to the same symbols for clarity. It is noted that, in FIG. 11, the P-type heavily doped regions 111 and 112 replace the N-type heavily doped regions 751 and 752. The junction B has a low breakdown voltage since the regions 111 and 112 adjacent to the N well and P substrate are heavily doped. The ESD protection device shown in FIG. 11 may be included in the input circuitries shown in FIGS. 8 and 9.

Fourth Embodiment

Figure 12:
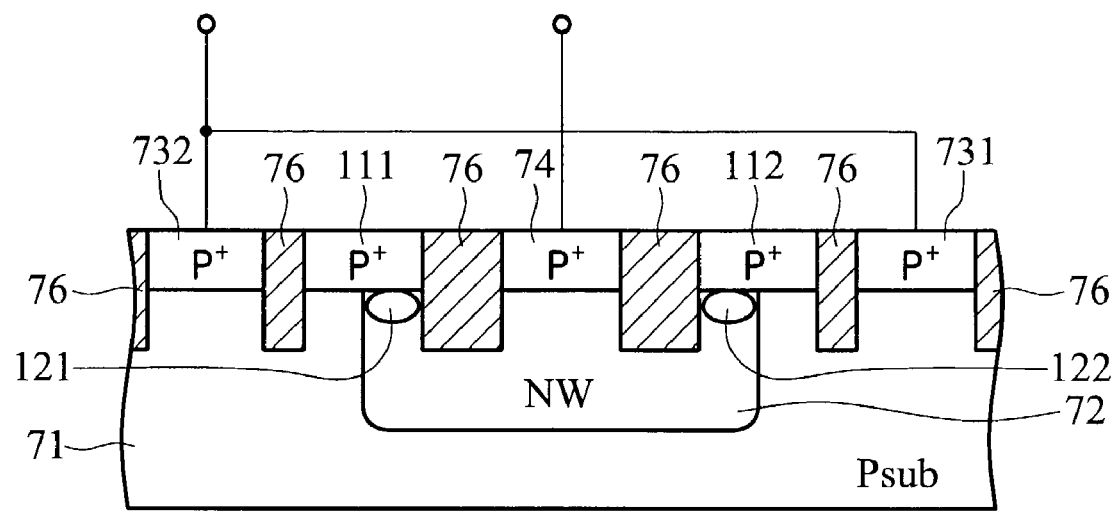
FIG. 12 is a diagram showing an ESD protection device according to a fourth embodiment of the invention.

FIG. 12 is a diagram showing an ESD protection device according to a fourth embodiment of the invention. The same elements in FIGS. 11 and 12 refer to the same symbols for clarity. It is noted that there are N-type ESD implantation regions 121 and 122 below the P-type heavily doped regions 111 and 112, in addition to the device shown in FIG. 11. The N-type ESD implantation regions 121 and 122 are doped more heavily than the N-well 72, which forms a junction therebetween with a lower breakdown voltage. The ESD protection device shown in FIG. 12 may be included in the input circuitries shown in FIGS. 8 and 9.

Fifth Embodiment

Figure 13:
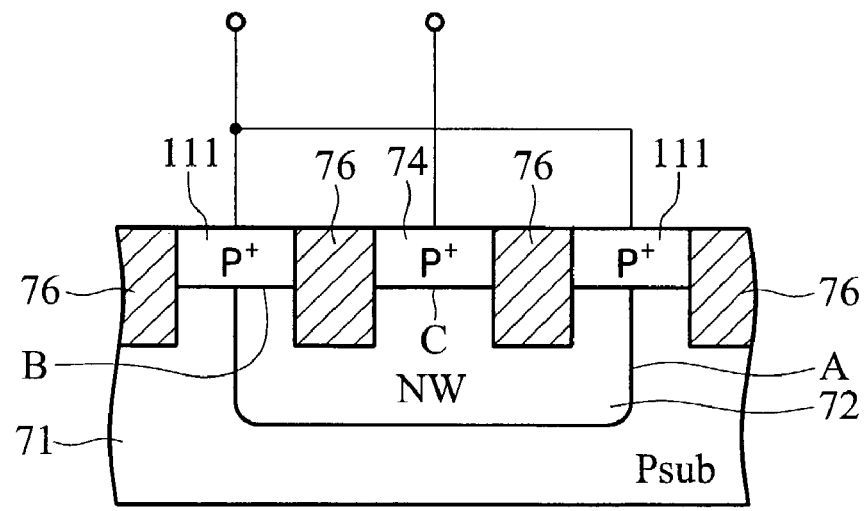
FIG. 13 is a diagram showing an ESD protection device according to a fifth embodiment of the invention.

FIG. 13 is a diagram showing an ESD protection device according to a fifth embodiment of the invention. The same elements in FIGS. 11 and 13 refer to the same symbols for clarity. It is noted that the P-type heavily doped region 731 and 732 are removed. Instead, the P-type heavily doped regions 111 and 112 are used as contact regions for the P substrate 71 since the regions 111 and 112 only couple the P substrate 71 to another element or to receive a voltage level but keep the N well 72 floated. The ESD protection device shown in FIG. 13 may be included in the input circuitries shown in FIGS. 8 and 9.

Sixth Embodiment

Figure 14:
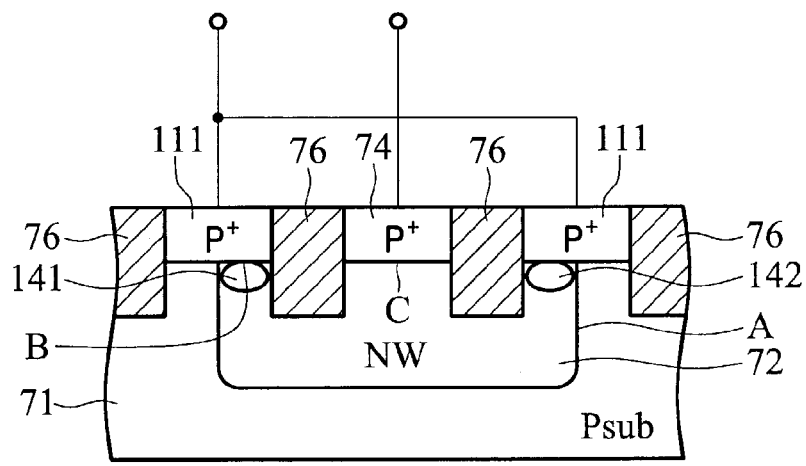
FIG. 14 is a diagram showing an ESD protection device according to a sixth embodiment of the invention.

FIG. 14 is a diagram showing an ESD protection device according to a sixth embodiment of the invention. The same elements in FIGS. 13 and 14 refer to the same symbols for clarity. It is noted that there are N-type ESD implantation regions 141 and 142 below the P-type heavily doped regions 111 and 112, in addition to the device shown in FIG. 13. The N-type ESD implantation regions 141 and 142 are doped more heavily than the N-well 72, which forms a junction therebetween with a lower breakdown voltage. The ESD protection device shown in FIG. 14 may be included in the input circuitries shown in FIGS. 8 and 9.

Seventh Embodiment

Figure 15:
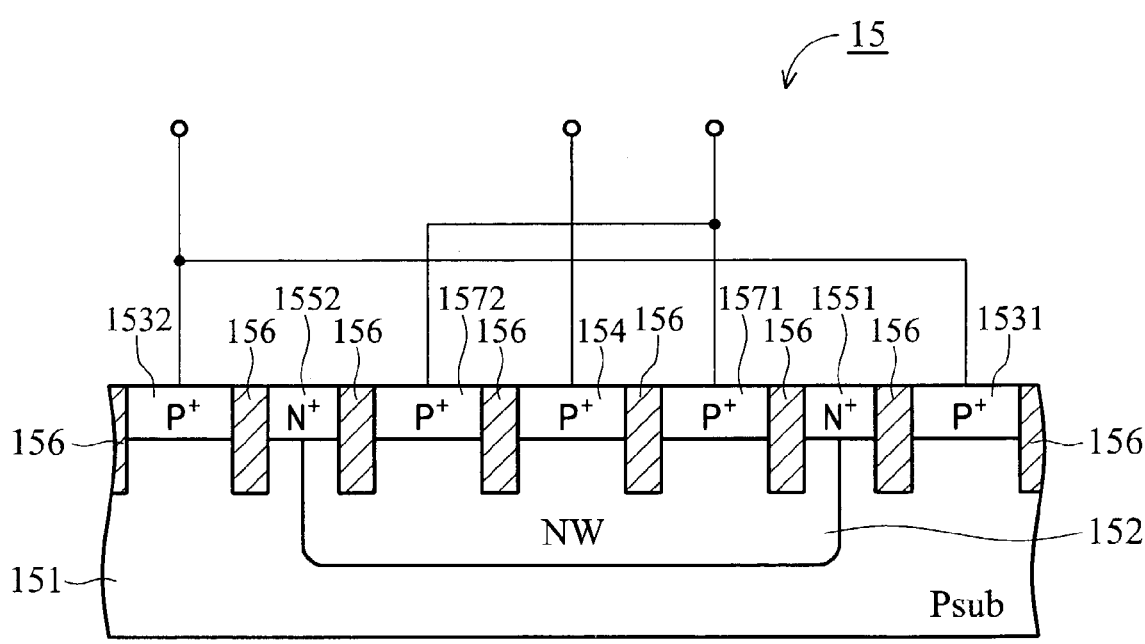
FIG. 15 is a diagram showing an ESD protection device according to a seventh embodiment of the invention.

FIG. 15 is a diagram showing an ESD protection device according to a seventh embodiment of the invention. The ESD protection device 15 includes a P substrate 151, a N well 152 in the P substrate 151, P-type heavily doped regions 1531 and 1532 in the P substrate 151, P-type heavily doped region 154, 1571 and 1572 in the N well 152, N-type heavily doped regions 1551 and 1552 adjacent to the N well 152, and isolation layers 156 isolating the doped regions 1531, 1532, 154, 1571, 1572, 1551 and 1552. Thus formed, the structure is equivalent to a combo LVTPNP having two collectors. Similarly to the ESD protection device shown in FIG. 7, it provides a current path between the emitter and collector except that it has an additional collector formed by the P-type heavily doped regions 1571 and 1572.

Figure 16:
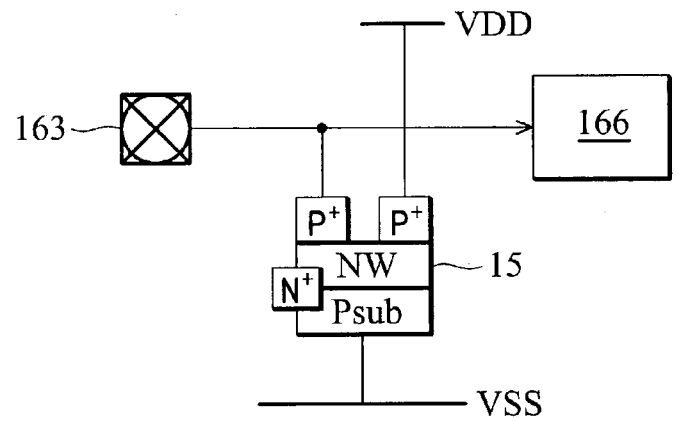
FIG. 16 is a diagram showing an input circuitry including the ESD protection device in FIG. 15.

FIG. 16 is a diagram showing an input circuitry including the ESD protection device in FIG. 15. The emitter of the ESD protection device 15 is coupled to the input pad 163. The first collector is coupled to the power supply VSS and the second collector is coupled to the power supply VDD. No ESD clamp circuit is used since the ESD protection device 15 already provides ESD paths between the input pad 163 and the power supply VDD, the input pad 163 and the power supply VSS, and the power supply VDD and VSS.

Eighth Embodiment

Figure 17:
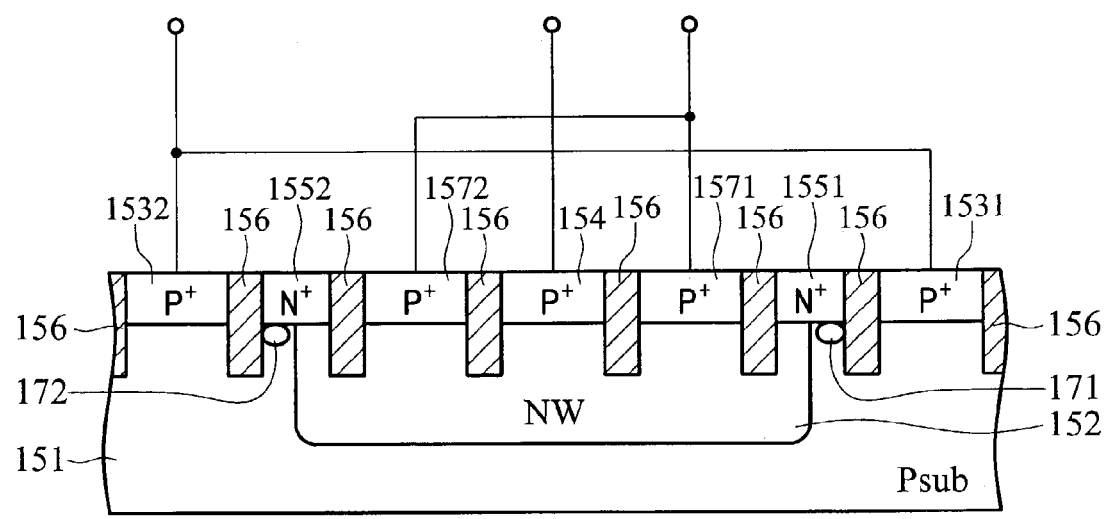
FIG. 17 is a diagram showing an ESD protection device according to a eighth embodiment of the invention.

FIG. 17 is a diagram showing an ESD protection device according to an eighth embodiment of the invention. The same elements in FIGS. 15 and 17 refer to the same symbols for clarity. It is noted that there are P-type ESD implantation regions 171 and 172 below the N-type heavily doped regions 1551 and 1552, in addition to the device shown in FIG. 15. The ESD implantation regions 171 and 172 are doped more heavily than the P substrate, which forms a junction therebetween with a lower breakdown voltage. The ESD protection device shown in FIG. 17 may be included in the input circuitry shown in FIG. 16.

Ninth Embodiment

FIG. 18 is a diagram showing an ESD protection device according to a ninth embodiment of the invention. The same elements in FIGS. 15 and 18 refer to the same symbols for clarity. It is noted that, in FIG. 18, the P-type heavily doped regions 181 and 182 replace the N-type heavily doped regions 1551 and 1552. Similarly to the ESD protection device shown in FIG. 11, the junction B has a low breakdown voltage since the regions 181 and 182 adjacent to the N well and P substrate are heavily doped. The ESD protection device shown in FIG. 18 may be included in the input circuitry shown in FIG. 16.

Tenth Embodiment

FIG. 19 is a diagram showing an ESD protection device according to a tenth embodiment of the invention. The same elements in FIGS. 18 and 19 refer to the same symbols for clarity. It is noted that there are N-type ESD implantation regions 191 and 192 below the P-type heavily doped regions 181 and 182, in addition to the device shown in FIG. 18. The N-type ESD implantation regions 191 and 192 are doped more heavily than the N-well 152, which forms a junction therebetween with a lower breakdown voltage. The ESD protection device shown in FIG. 19 may be included in the input circuitry shown in FIG. 16.

In conclusion, the present invention provides a new ESD protection device including a PNP transistor formed by the P substrate, N well and P-type heavily doped region in the N well, and a heavily doped region adjacent to the P substrate and N well, wherein the N well is floated. Thus formed, the structure functions as a PNP bipolar junction transistor with base floated and a low breakdown voltage. Accordingly, only the PN or NP junction in the BJT is forward biased when an input signal with voltage levels higher than VDD or lower than VSS is received during normal operations so that there is no leakage current. Moreover, the ESD protection device is quickly triggered to protect the internal circuit from damage when an ESD pulse zapping the input pad due to its low breakdown voltage.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An ESD protection device for input signals with voltage level larger than VDD or less than VSS, which provides an ESD path from a first to a second node, the device comprising:
   a substrate of a first conductivity type coupled to the first node;
   a first doped region of a second conductivity type in the substrate, wherein the first doped region is floated;
   a second doped region of the first conductivity type in the first doped region, coupled to the second node; and
   a third doped region in the substrate, adjacent to the first doped region.

2. The ESD protection device as claimed in claim 1, wherein the third doped region is of the second conductivity type and the doping concentration of the third doped region is higher than that of the first doped region.

3. The ESD protection device as claimed in claim 2 further comprising a fourth doped region of the first conductivity type in the substrate, coupling the substrate to the first node.

4. The ESD protection device as claimed in claim 3 further comprising:
   an ESD implantation region in the substrate and immediately below the third doped region; and
   a plurality of isolation layers in the substrate, isolating the second, third and fourth doped regions from each other.

5. The ESD protection device as claimed in claim 4, wherein the first and second conductivity types are P and N respectively.

6. The ESD protection device as claimed in claim 2, wherein the internal circuit receives a first power supply voltage and a second power supply voltage lower than the first power supply voltage through a first and second power line respectively, and an input signal through an I/O pad, the first and second node coupled to the second power line and the I/O pad respectively, wherein the input signal has a maximum voltage level higher than the first power supply voltage and a minimum voltage level lower than the second power supply voltage.

7. The ESD protection device as claimed in claim 4 further comprising:
   an ESD clamp circuit coupled between the first and second power line; and
   a diode having an anode coupled to the first node and a cathode coupled to the second power line.

8. The ESD protection device as claimed in claim 4 further comprising:
   an ESD clamp circuit coupled between the first and second power line; and
   a plurality of diodes serially connected in a same direction between the first node and the second power line.

9. The ESD protection device as claimed in claim 1, wherein the third doped region is of the first conductivity type and the doping concentration of the third doped region is higher than that of the substrate.

10. The ESD protection device as claimed in claim 9 further comprising a fourth doped region of the first conductivity in the substrate, coupling the substrate to the first node.

11. The ESD protection device as claimed in claim 10 further comprising:
    an ESD implantation region in the substrate and immediately below the third doped region; and
    a plurality of isolation layers in the substrate, isolating the second, third and fourth doped regions from each other.

12. The ESD protection device as claimed in claim 11, wherein the first and second conductivity types are P and N respectively.

13. The ESD protection device as claimed in claim 9, wherein the internal circuit receives a first power supply voltage and a second power supply voltage lower than the first power supply voltage through a first and second power line respectively, and receives an input signal through an I/O pad, the first and second node are coupled to the second power line and the I/O pad respectively, and the input signal has a maximum voltage level higher than the first power supply voltage and a minimum voltage level lower than the second power supply voltage.

14. The ESD protection device as claimed in claim 13 further comprising:
    an ESD clamp circuit coupled between the first and second power line; and
    a diode having an anode coupled to the first node and a cathode coupled to the second power line.

15. The ESD protection device as claimed in claim 13 further comprising:
    an ESD clamp circuit coupled between the first and second power line; and
    a plurality of diodes serially connected in a same direction between the first node and the second power line.

16. The ESD protection device as claimed in claim 1, wherein the third doped region is of the first conductivity type and couples the substrate to the first node and the doping concentration of the third doped region is higher than that of the substrate.

17. The ESD protection device as claimed in claim 16 further comprising:
    an ESD implantation region in the substrate and immediately below the third doped region; and
    a plurality of isolation layers in the substrate, isolating the second and third doped region from each other.

18. The ESD protection device as claimed in claim 17, wherein the first and second conductivity types are P and N respectively.

19. The ESD protection device as claimed in claim 16, wherein the internal circuit receives a first power supply voltage and a second power supply voltage lower than the first power supply voltage through a first and second power line respectively, and receives an input signal through an I/O pad, the first and second node are coupled to the second power line and the I/O pad respectively, and the input signal has a maximum voltage level higher than the first power supply voltage and a minimum voltage level lower than the second power supply voltage.

20. The ESD protection device as claimed in claim 19 further comprising:
    an ESD clamp circuit coupled between the first and second power lines; and
    a diode having an anode coupled to the first node and a cathode coupled to the second power line.

21. The ESD protection device as claimed in claim 19 further comprising:
    an ESD clamp circuit coupled between the first and second power lines; and
    a plurality of diodes serially connected in a same direction between the first node and the second power line.

22. An ESD protection device for input signals with voltage level larger than VDD or less than VSS, which provides an ESD path from a first to a second node and the second to a third node, the device comprising:
    a substrate of a first conductivity type coupled to the first node;

a first doped region of a second conductivity type in the substrate, wherein the first doped region is floated;

a second doped region of the first conductivity type in the first doped region, coupled to the second node;

a third doped region in the substrate, adjacent to the first doped region; and a fourth doped region of the first conductivity type in the first doped region, coupled to the third node.

23. The ESD protection device as claimed in claim 22, wherein the third doped region is of the second conductivity type and the doping concentration of the third doped region is higher than that of the first doped region.

24. The ESD protection device as claimed in claim 23 further comprising a fifth doped region of the first conductivity type in the substrate, coupling the substrate to the first node.

25. The ESD protection device as claimed in claim 24 further comprising:

an ESD implantation region in the substrate and immediately below the third doped region; and a plurality of isolation layers in the substrate, isolating the second, third, fourth and fifth doped regions from each other.

26. The ESD protection device as claimed in claim 25, wherein the first and second conductivity types are P and N respectively.

27. The ESD protection device as claimed in claim 23, wherein the internal circuit receives a first power supply voltage and a second power supply voltage lower than the first power supply voltage through a first and second power line respectively, and receives an input signal through an I/O pad, the first and second node are coupled to the second power line and the I/O pad respectively, and the input signal has a maximum voltage level higher than the first power supply voltage and a minimum voltage level lower than the second power supply voltage.

28. The ESD protection device as claimed in claim 22, wherein the third doped region is of the first conductivity type and the doping concentration of the third doped region is higher than that of the substrate.

29. The ESD protection device as claimed in claim 28 further comprising a fifth doped region of the first conductivity in the substrate, coupling the substrate to the first node.

30. The ESD protection device as claimed in claim 29 further comprising:

an ESD implantation region in the substrate and immediately below the third doped region;

a plurality of isolation layers in the substrate, isolating the second, third, fourth and fifth doped regions from each other.

31. The ESD protection device as claimed in claim 30, wherein the first and second conductivity types are P and N respectively.

32. The ESD protection device as claimed in claim 28, wherein the internal circuit receives a first power supply voltage and a second power supply voltage lower than the first power supply voltage through a first and second power line respectively, and receives an input signal through an I/O pad, the first and second node are coupled to the second power line and the I/O pad respectively, and the input signal has a maximum voltage level higher than the first power supply voltage and a minimum voltage level lower than the second power supply voltage.

33. The ESD protection device as claimed in claim 22, wherein the third doped region is of the first conductivity type and couples the substrate to the first node and the doping concentration of the third doped region is higher than that of the substrate.

34. The ESD protection device as claimed in claim 33 further comprising:

an ESD implantation region in the substrate and immediately below the third doped region; and a plurality of isolation layers in the substrate, isolating the second, third and fourth doped regions from each other.

35. The ESD protection device as claimed in claim 34, wherein the first and second conductivity types are P and N respectively.

36. The ESD protection device as claimed in claim 33, wherein the internal circuit receives a first power supply voltage and a second power supply voltage lower than the first power supply voltage through a first and second power line respectively, and receives an input signal through an I/O pad, the first and second node are coupled to the second power line and the I/O pad respectively, and the input signal has a maximum voltage level higher than the first power supply voltage and a minimum voltage level lower than the second power supply voltage.

* * * * *